United States Patent
Katsap et al.

(10) Patent No.: US 6,420,714 B1
(45) Date of Patent: Jul. 16, 2002

(54) ELECTRON BEAM IMAGING APPARATUS

(75) Inventors: Victor Katsap, Belle Mead, NJ (US); Eric Munro; John Andrew Rouse, both of London (GB); Warren K Waskiewicz, Clinton, NJ (US); Xieqing Zhu, London (GB)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/591,626

(22) Filed: Jun. 9, 2000

Related U.S. Application Data

(60) Provisional application No. 60/158,268, filed on Oct. 7, 1999.

(51) Int. Cl.⁷ .............................. G21K 1/08; G21K 5/00; H01J 3/14; H01J 5/26
(52) U.S. Cl. .................... 250/396 ML; 250/492.22; 250/396 R
(58) Field of Search ................ 250/492.2, 455, 250/396 ML, 398

(56) References Cited

U.S. PATENT DOCUMENTS

| | | | |
|---|---|---|---|
| 4,198,569 A | 4/1980 | Takayama | 250/492 |
| 5,172,473 A | 12/1992 | Burns et al. | 29/885 |
| 5,260,151 A | 11/1993 | Berger et al. | 430/5 |
| 5,633,507 A | 5/1997 | Pfeiffer et al. | 250/492.23 |
| 5,831,270 A | 11/1998 | Nakasuji | 250/396 |
| 5,847,402 A | 12/1998 | Nakasuji | 250/492.2 |
| 5,864,142 A | 1/1999 | Muraki et al. | 250/491.1 |
| 6,011,268 A * | 1/2000 | Nakasugi et al. | 250/492.22 |

OTHER PUBLICATIONS

M.B. Heritage, *J. Vac. Sci. Technol,* "Electron–Projection Microfabrication System", vol. 12, No. 6, pp. 1135–1410. Nov./Dec. 1975.

Waskiewicz et al., *SPIE,* "Electron–Optical Design for the Scalpel Proof–of–Concept Tool", vol. 2522/pp. 13–22.

Waskiewicz et al., *Microelectronic Engineering,* Electron Optics Method for High–Throughput in a Scalpel System: Preliminary Analysis, vol. 41/42, pp. 215–218, 1998.

* cited by examiner

Primary Examiner—Jack Berman
Assistant Examiner—K Fernandez
(74) Attorney, Agent, or Firm—Richard J. Botos

(57) ABSTRACT

An apparatus for projection lithography is disclosed. The apparatus has at least one magnetic doublet lens. An aperture scatter filter is interposed between the two lenses of the magnetic doublet lens. The aperture scatter filter is in the back focal plane of the magnetic doublet lens system, or in an equivalent conjugate plane thereof. The apparatus also has two magnetic clamps interposed between the two lenses in the magnetic doublet lens. The clamps are positioned and configured to prevent substantial overlap of the magnetic lens fields. The magnetic clamps are positioned so that the magnetic fields from the lenses in the magnetic doublet lens do not extend to the aperture scatter filter.

6 Claims, 4 Drawing Sheets

ELECTRON BEAM IMAGING APPARATUS

PRIORITY APPLICATION INFORMATION

This application claims priority of Provisional Patent Application Serial No. 60/158,268 filed Oct. 7, 1999 and entitled "Electron Beam Imaging Apparatus."

BACKGROUND OF THE INVENTION

1. Technical Field

The present invention is directed to a lithographic process for device fabrication in which charged particle energy is used to delineate a pattern in an energy sensitive material. The pattern is delineated by projecting the charged particle energy onto a patterned mask, thereby projecting an image of the mask onto the energy sensitive material.

2. Art Background

In device processing, an energy sensitive material, denominated a resist, is coated on a substrate such as a semiconductor wafer (e.g., a silicon wafer), a ferroelectric wafer, an insulating wafer, (e.g. a sapphire wafer), a chromium layer supported by a substrate, or a substrate having a combination of such materials. An image of a pattern is introduced into the resist by subjecting the resist to patterned radiation. The image is then developed to produce a patterned resist using expedients such as a solution-based developer or a plasma etch to remove one of either the exposed portion or the unexposed portion of the resist. The developed pattern is then used in subsequent processing, e.g. a mask to process, i.e. etch, the underlying layer. The resist is then removed. For many devices, subsequent layers are formed and the process is repeated to form overlying patterns in the device.

In recent years, lithographic processes in which a charged particle beam is used to delineate a pattern in an energy sensitive resist material have been developed Such processes provide high resolution and high throughput. One such process is the SCALPEL® (scattering with angular limitation projection electron beam lithography) process. The SCALPEL® process is described in U.S. Pat. No. 5,260,151 which is hereby incorporated by reference.

Referring to FIG. 1, a doublet lens system 15 is used in the lithography tool for the SCALPEL® process. A first lens system (not shown) is used to direct and focus incident radiation 10 from the radiation source (not shown) onto the mask 20. The mask 20 is used to pattern particle beam 10. The entire mask 20 is not illuminated at once. Mask 20, as shown, consists of a membrane 13, which is transparent to the particle beams incident thereon, and blocking regions 14.

The developed image of the mask pattern is defined by blocking regions 14, which scatter the particle beams 10 incident thereon. Unblocked illumination, illustrated as beams 12, is transmitted through the membrane regions 13. Blocked illumination, illustrated as beams 11 is caused to converge by means of a first electromagnetic/electrostatic projector lens 30 in lens system 15. Filter 19 is an aperture scatter filter. The aperture scatter filter 19 is designed so that the unscattered radiation (beams 12) passes through the aperture 21 therein. The scattered radiation 11 is blocked by the aperture scatter filter 19, which is located in the mutual focal plane of the lenses 30 and 31.

Second projector lens 31 of lens system 15 is of such configuration and so powered as to bring the unscattered beams 12 into an approximately parallel relationship. The action of the lens 31 is sufficient to direct beams 12 into orthogonal incidence onto wafer 24.

Lens system 15 consists of two lenses. Consequently, the lens system is referred to as a doublet electromagnetic lens arrangement. Such a doublet electromagnetic lens arrangement is described in Waskiewicz, W., et al., "Electron-optics method for High-Throughput in a SCALPEL system: preliminary analysis," Microelectronic *Engineering*, Vol. 41/42, pp. 215–218 (1998). The doublet electromagnetic lens system described in Waskiewicz et al. provides telecentric reduction imaging from the mask to the wafer. Such an arrangement uses two lenses of similar construction. The lenses are laid out sequentially and separated by a distance equal to the sum of their two focal lengths. Referring again to FIG. 1, the object (i.e. the mask 20) is located in the back focal plane of the first projector lens 30 of lens system 15. An image of the mask 20 is formed at the front focal plane (i.e. the layer of energy sensitive material 23 on wafer 24) of the second projector lens 31 of second lens system 15. The magnification provided by the lens system is determined by the ratio of the focal length of lens 30 to the focal length of lens 31. The bore (D) to gap (S) ratio for both lenses are identical and the excitations (NI) are set equal but opposite.

When designed properly, the doublet lens not only substantially eliminates the rotation introduced into the image by an individual lens in the doublet, but also eliminates rotation-related aberrations in the image. These aberrations are primarily chromatic aberrations. Removing these aberrations provides the lowest total image blur. Doublet lens systems are described in Heritage, M. B., "Electron-projection microfabrication system," *J. Vac. Sci. Technol.*, Vol. 12, No. 6, pp. 1135–1140 (1975), which is hereby incorporated by reference.

In the classic magnetic doublet design, the first and second lenses are separated along their common optical axis to ensure that there is a space between the lenses that is field-free. The field-free space is a space that is not affected by the magnetic field generated by the lenses. Typically, both lenses have a common focal length (F) within this field-free space. Such an arrangement is illustrated in FIG. 2. FIG. 2 illustrates the magnetic flux as a function of distance along the optical axis relative to the position of magnetic lenses 30 and 31. In the region between lenses 30 and 31 the magnetic flux is zero. This is the desired field-free space.

However, in certain applications, design constraints do not permit the spacing between the first and second lenses that provides for a field-free space. In the lithography tool for the SCALPEL® process, for example, the mutual focal plane of lenses 30 and 31 is at the apertured scatter filter 19. Furthermore, in order to increase the speed at which the image is written (and thereby to achieve the desired throughput from the tool) the electron beam scans about the optical axis. In order to control the off-axis aberrations, e.g. astigmatism, that result from off-axis scanning, the bore of the doublet lens is increased while the axial separation between the two lenses either remains the same or is shortened to control space-charge blur. Consequently, the magnetic fields of the doublet lens overlap. This problem is illustrated in FIG. 3. In FIG. 3, the magnetic flux of each lens is affected by this overlap. This is observed with reference to dashed line 50 in FIG. 3. Observe that, due to the proximity between lenses 30 and 31, the flux as a function of axial position for lens 31 on one side of line 50 is not a mirror image of flux as a function of axial position on the other side of line 50. Thus, the desired axial magnetic field symmetry for lens 31 (and for lens 30) in FIG. 3 is not preserved.

This overlap causes field distortion. Also, the apertured scatter filter 19 is immersed in the magnetic field of lenses 30 and 31. Since this field overlap compounds aberrations and total blur growth and also causes projection magnification changes. Consequently, a solution to the magnetic field overlap of the projection lens doublet that is compatible with the SCALPEL® tool design is sought.

SUMMARY OF INVENTION

The present invention is directed to a magnetic doublet lens system in which the spacing between the two lenses is such that their magnetic fields overlap. The magnetic doublet lens system is equipped with magnetic clamps that effect substantial separation of the magnetic fields. The magnetic clamps are made of a ferromagnetic material. The present invention is also directed to an apparatus for electron beam lithography that has a magnetic doublet lens system that is equipped with magnetic clamps to effect substantial separation of the magnetic fields between the two lenses. Substantial separation, in the context of the present invention, is sufficient separation of ensure that the magnetic field of one lens in the doublet lens system is not adversely affected by the magnetic field of the other lens in the magnetic doublet lens system. Adverse affects are doublet compound image aberrations, total blur growth and projection magnification changes attributable to magnetic field overlap. However, one skilled in the art will appreciate that the magnetic clamps have a configuration and placement that preserves the symmetry of the magnetic doublet lens and the common focal plane of the two lenses in the magnetic doublet lens system. For example, if the magnetic doublet lens is designed for 4:1 image demagnification (i.e., image reduction), then the magnetic clamps are designed to preserve this relationship. An example of a suitable clamp design for such a magnetic doublet lens is one in which the dimensional relationship (i.e. for cylindrical clamps the ratio of height and diameter) is also 4:1.

DETAILED DESCRIPTION

In the present invention, magnetic clamps are inserted between the individual lenses in a magnetic doublet lens system. In the embodiment of the present invention wherein the magnetic doublet lens system with the magnetic claims is inserted into an electron beam lithography tool, an apertured scatter filter is inserted in an essentially field-free space between the two lenses, wherein the essentially field-free space is provided by the magnetic clamps.

The essentially field-free space is obtained by using the magnetic clamps to effect substantial separation of the magnetic fields of the two lenses. By substantially separating the magnetic fields, doublet compound aberrations, total blur growth and projection magnification changes attributable to magnetic field overlap are avoided.

For example, magnetic lenses have a spherical aberration co-efficient ($C_{sph}$) that is proportional to the integral of the magnetic field flux density first derivative squared (dB/dz) $^2$dz. This is characterized by the following formula:

$$C_{sph} \sim \int (dB/dz)^2 dz.$$

Other aberrations and distortions depend on the field distribution B(z) in the same way. Any distortion in the magnetic field is likely to add aberrations and distortions into the final image. In the present invention, magnetic clamps are designed to prevent distortions in the magnetic field that are caused by overlap of the magnetic fields in the magnetic doublet lens system. However, the magnetic clamps are also designed and placed to preserve the symmetry of the magnetic doublet lens. As one skilled in the art is aware, symmetry is required to maintain beam rotation and related anisotropic aberrations within the limits required for acceptable imaging.

Figure 1:
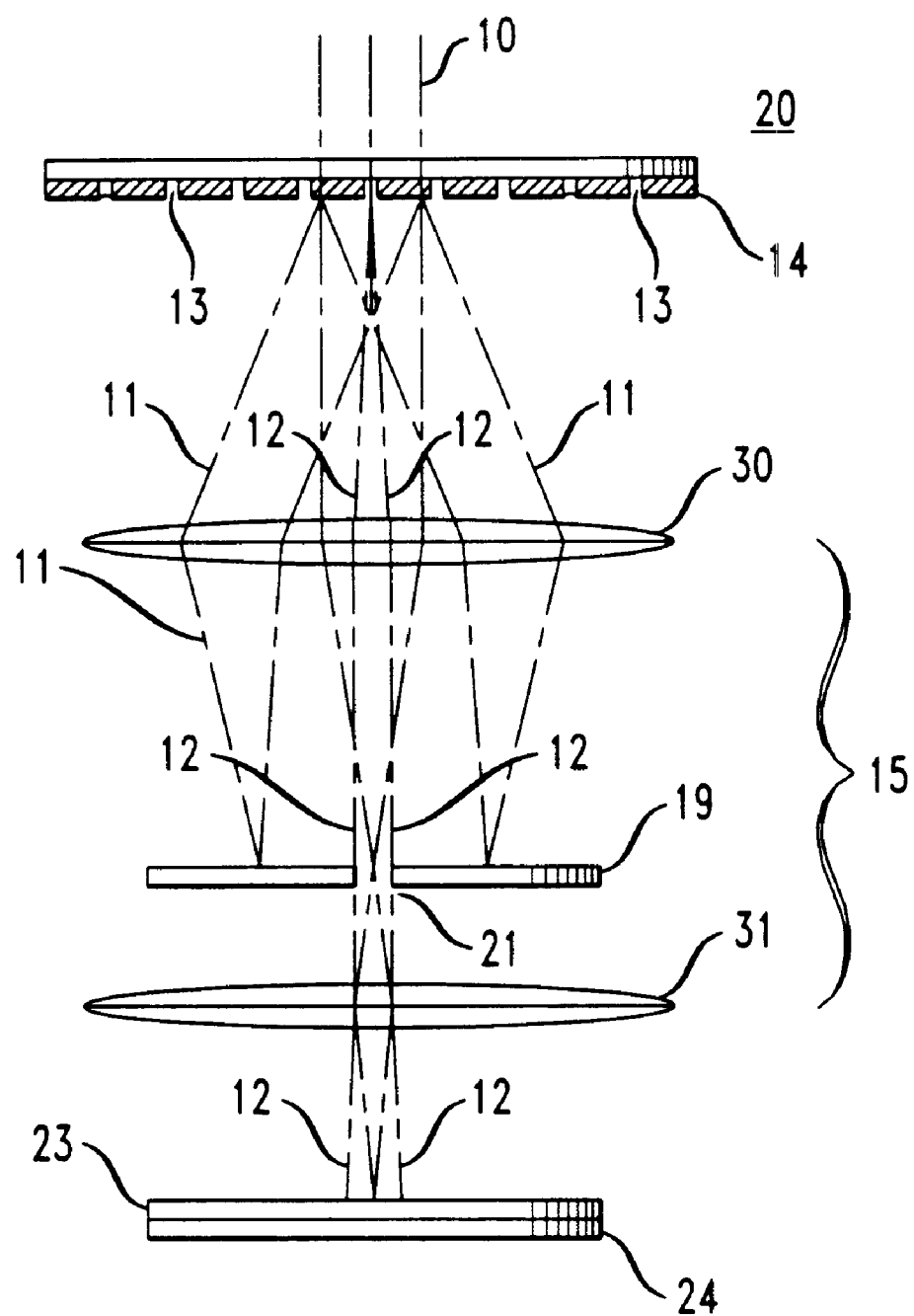
FIG. 1 is a schematic representation of an electron beam lithography tool.
Figure 2:
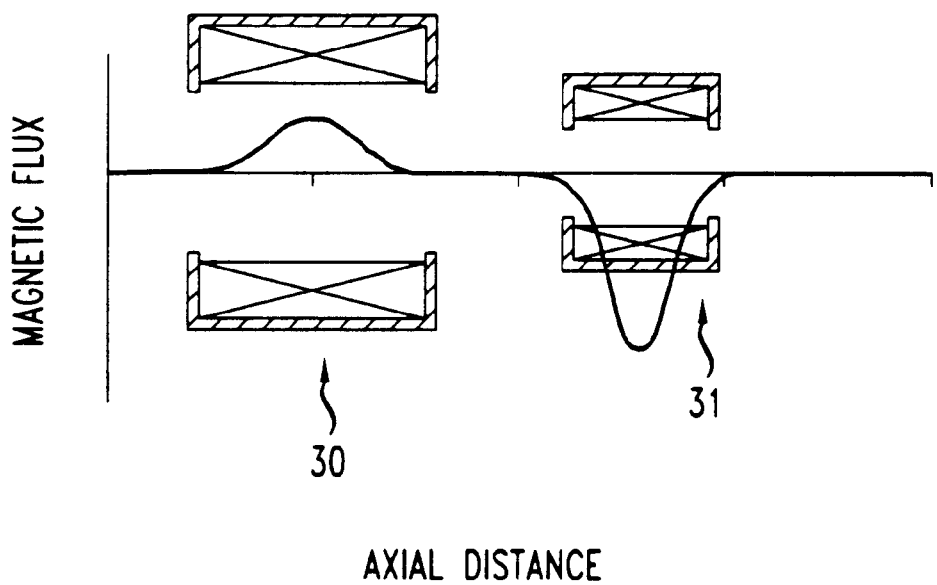
FIG. 2 illustrates the magnetic flux of a magnetic doublet lens arrangement in which the lenses are separated by a field-free space.
Figure 3:
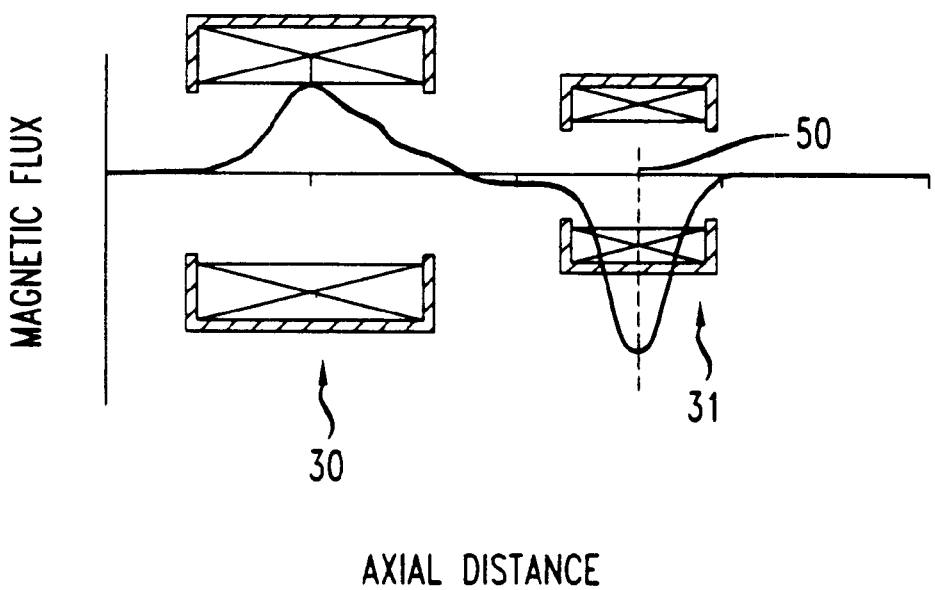
FIG. 3 illustrates the magnetic flux of a magnetic doublet lens arrangement in which the magnetic flux from each lens overlaps.
Figure 4:
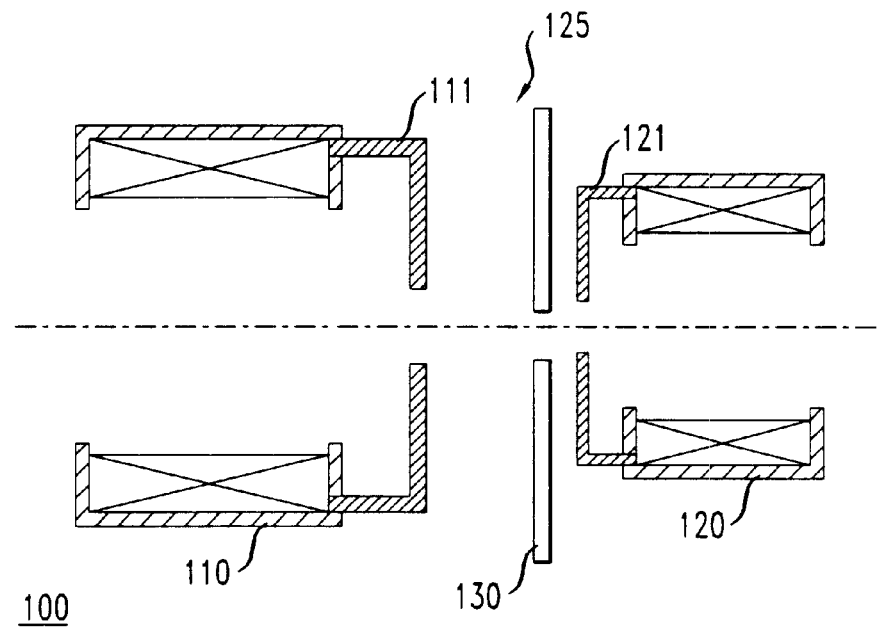
FIG. 4 is a schematic cross-section of a doublet lens with magnetic clamps that effect separation of the magnetic fields associated with the two individual lenses in the doublet.

A schematic of one embodiment of the present invention is illustrated in FIG. 4. FIG. 4 illustrates a cross-section of a magnetic lens doublet system 100. The magnetic lens doublet system has a first lens 110 and a second lens 120. Lens 110 is equipped with magnetic clamp 111. Lens 120 is equipped with magnetic clamp 121. Magnetic clamps 111 and 121 are a ferromagnetic material, such as soft iron or ferrite. The size, configuration and location of the magnetic clamps are determined by a number of factors. The first factor is that the magnetic clamps prevent the fields from lenses 110 and 120 from substantially penetrating into the region 125 between the magnetic clamps. In the embodiment of the present invention wherein the lens system is placed in an electron beam lithography tool, the apertured scatter filter 130 is placed in region 125. The second factor is that the magnetic clamps must be configured so as not to interfere with the radiation transmitted through the lens system. The third factor is that the magnetic clamps must be sized to preserve the symmetry of the doublet. That relationship is reflected by symmetry of the doublet about the common focal plane of the lens. As previously noted, the desired symmetry of the axial magnetic field of a lens is not preserved when the magnetic fields of the two lenses in the magnetic doublet lens system overlap. Also, if the magnetic doublet lens system provides for a 4:1 image reduction, the magnetic lenses must have a size and a placement along the lens system focal length that preserves that relationship.

Figure 5:
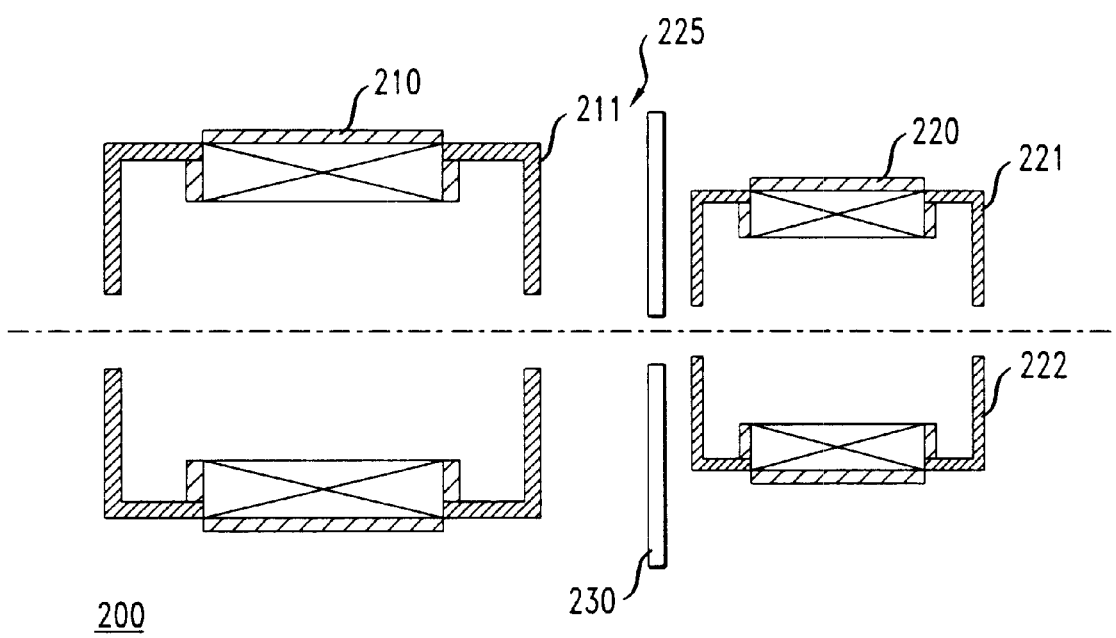
FIG. 5 is a schematic cross-section of an alternative embodiment of a doublet lens with magnetic clamps in which magnetic clamps are affixed at both ends of the doublet lens.

Another embodiment of the present invention is illustrated in FIG. 5. In this embodiment, each lens, 210 and 220 of magnetic doublet lens 200 has two magnetic clamps. Lens 210 is equipped with lenses 211 and 212. Lens 220 is equipped with clamps 221 and 222. As in the previous embodiment, an apertured scatter filter 230 is placed in the field-free space 225 between lens 210 and lens 220.

Figure 6:
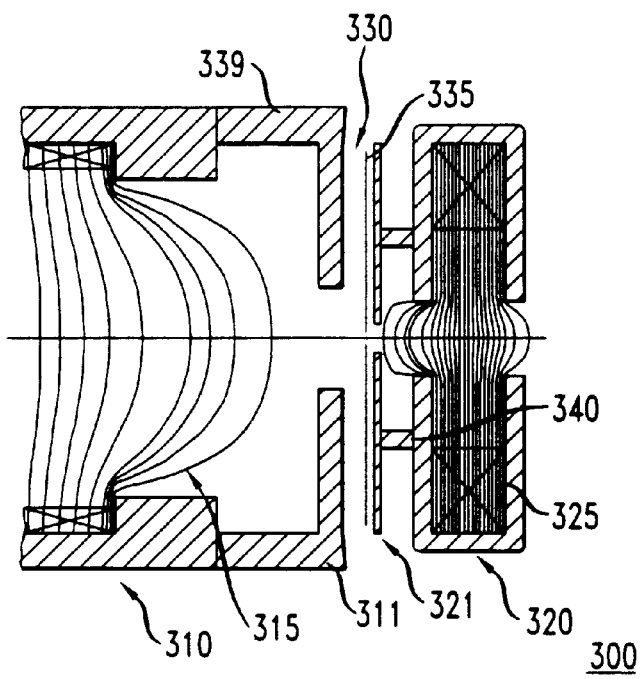
FIG. 6 is a schematic cross-section of a doublet lens system of the present invention that illustrates the separation of the magnetic fields from the two lenses in the lens system that is provided by the magnetic clamps.

The doublet of the projection lens system of the present invention is described with reference to FIG. 6. The lens 310 of doublet lens 300 generates a field 315 (drawn as a series of lines). The field 315 is contained by magnetic clamp 311. Similarly, the lens 320 of doublet lens 300 generates a field 325 (drawn as a series of lines). The field 325 is contained by magnetic clamp 321. As illustrated in FIG. 6, the magnetic field lines 315 and 325 do not extend into the space 330 that contains the apertured scatter filter 335. Lens 310 is connected to magnetic clamp 311 via connector 339. Lens 320 is connected to magnetic clamp 321 via connector 340. Connectors 339 and 340 are a magnetic material such as ferrite or soft iron.

EXAMPLE

Figure 7:
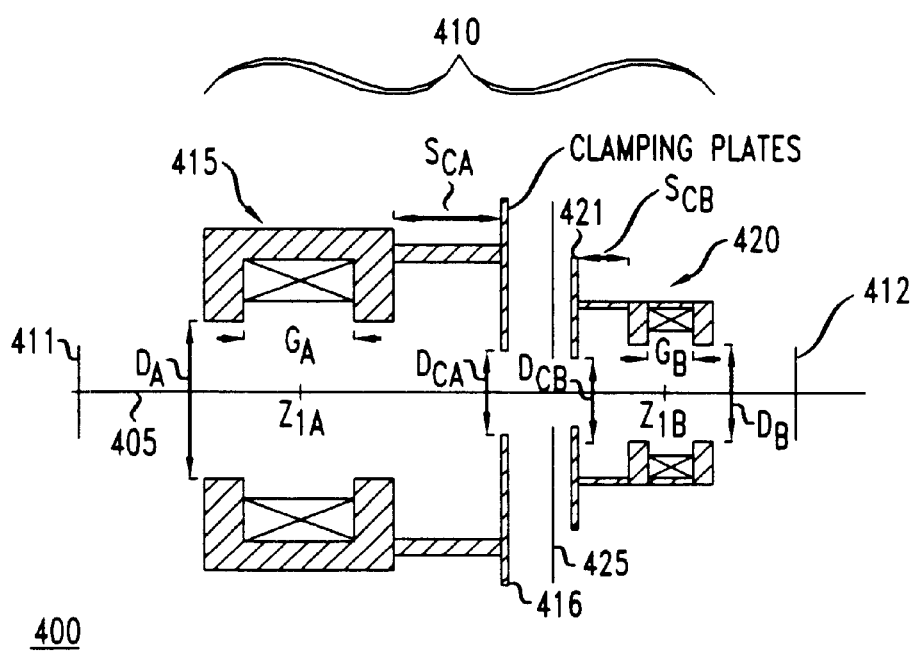
FIG. 7 is a schematic cross-section of a doublet lens system of present invention that provides for 4:1 demagnification of the image in the beam transmitted through the lens.

The following example is described with reference to FIG. 7. FIG. 7 is a schematic of a magnetic doublet lens system placed in an electron beam lithography tool. The tool 400 has an optical axis 405. The magnetic doublet lens system 410 is placed between the mask plane 411 and the image plane 412. The magnetic doublet lens system 410 has a first lens 415 and a second lens 420. Both lenses 415 and 420 have wound cores and soft iron bodies. First lens 415 is coupled to a first magnetic clamp 416. Second lens 420 is coupled to a second magnetic clamp 421. The clamps are the same material as the body of the lens (soft iron). An apertured scatter filter 425 is placed between the first magnetic clamp 416 and the second magnetic clamp 421.

The lens system 410 is configured to demagnify an image of the mask 411. The degree of demagnification is 0.25 (i.e., an image reduction of 4:1). The demagnified image is transmitted into an energy sensitive material on a wafer in image plane 412. The distance between the mask plane 411 and the apertured scatter filter is 320 mm. The distance between the image plane 412 and the apertured scatter filter 425 is 80 mm.

The lens system 410 is centered about the optical axis 405. Using the position of the apertured scatter filter 425 on the optical axis 405 as the zero reference point, the focal length of the first lens is −160 mm. The focal length of the second lens is 40 mm. The focal length of lens 415 is illustrated by the distance from the point $Z_{1A}$ to the apertured scatter filter 425 along the optical axis 405. The focal length of lens 420 is illustrated by the distance from the point $Z_{1B}$ to the apertured scatter filter 425 along the optical axis 405.

Lens 415 defines an opening $D_A$ that is 120 mm. The Internal length $G_A$ of lens 415 is also 120 mm. Lens 420 defines an opening $D_B$ that is 30 mm. The internal length $G_B$ of lens 420 is also 30 mm.

First magnetic clamp 416 defines an opening $D_{CA}$ that is 40 mm. The first magnetic clamp 416 is a distance $S_{CA}$ (80 mm) in a direction parallel to the optical axis. Second magnetic clamp 421 defines an opening $D_{CB}$ that is 10 mm. The second magnetic clamp 421 is a distance $S_{CB}$ (20 mm) from lens 420 in a direction parallel to the optical axis. Thus the 4:1 image reduction is achieved by a 4:1 relationship between the first lens 415 and the second lens 420.

The performance of the above described lens system was modeled. The performance of a system without the first and second magnetic clamps 416 and 421 (but otherwise identical) was also modeled. The performance of the two systems was then compared. The modeling was performed using second-order finite element modeling software from Munro's Electron Beam Software Ltd. of London, England.

The comparative results are summarized in the following table.

TABLE 1

|  | Without Clamps | With Clamps |
|---|---|---|
| Lens Excitation (AT) | 2112.71 | 2103.06 |
| Magnification | 0.2509 | 0.2501 |
| Rotation Angle (mrad) | −0.946 | −0.0262 |
| Landing Angle (mrad) | 0.12 | 0.12 |
| Beam Blur at center (nm) | 19.3 | 19.3 |
| Beam Blur at corner (nm) | 33.0 | 32.6 |

The comparison provided in Table 1 demonstrates the benefits of magnetic clamps. Specifically, the system without clamps had a much lower rotation angle in the region in which the apertured scatter filter was located compared to the system without clamps. This demonstrates that the field effects in the apertured scatter filter region were much lower in the system without clamps compared to the system with clamps. Furthermore, this improvement was obtained without an adverse effect on magnification, landing angle or beam blur. Also, as demonstrated by the reduction in lens excitation for the lens system with clamps, the lens system of the present invention is more efficient than a lens system without such clamps.

Although the present invention has been described in terms of numerous examples, one skilled in the art will appreciate that numerous other embodiments are within the scope of the following claims. Consequently, the preceding examples should not be construed as limiting the present invention in any way, except in a manner that is consistent with the following claims.

What is claimed is:

1. An apparatus for projection lithography comprising:
   a lens system comprising at least one magnetic doublet lens and a back focal plane filter positioned in the back focal plane or some equivalent conjugate plane of the magnetic doublet lens in the lens system, the back focal plane filter having a first aperture which is adapted to transmit insignificantly scattered radiation from a radiation source therethrough wherein the magnetic doublet lens system has a pair of ferromagnetic clamps, a first clamp associated with the first lens in the magnetic doublet lens system and a second clamp associated with the second lens in the magnetic lens, wherein the first clamp and the second clamp are configured to substantially separate the magnetic field of the first lens from the magnetic field of the second lens.

2. The apparatus of claim 1 wherein the magnetic clamps are made of a magnetic material.

3. The apparatus of claim 1 wherein the back focal plane filter is placed between the two lenses of the magnetic doublet lens and wherein the clamps are placed and configured to prevent the magnetic fields of the first and second lens from extending to the back focal plane filter.

4. The apparatus of claim 2 wherein the magnetic material is a ferromagnetic material.

5. The apparatus of claim 1 wherein the magnetic doublet lens has a symmetry for image magnification or demagnification and wherein the first and second clamps have a geometry and dimensions that are selected to preserve the symmetry of the magnetic doublet lens.

6. The apparatus of claim 5 wherein the magnetic doublet lens provides 4:1 image demagnification and the first clamp and the second clamp have a dimensional relationship such that the dimensions of the first clamp are four times the dimensions of the second clamp.

\* \* \* \* \*